United States Patent
Ha et al.

(10) Patent No.: US 10,903,794 B2
(45) Date of Patent: Jan. 26, 2021

(54) POWER AMPLIFIER DEVICE WITH IMPROVED RESPONSE SPEED

(71) Applicant: SAMSUNG ELECTRO-MECHANICS CO., LTD., Suwon-si (KR)

(72) Inventors: Jong Ok Ha, Suwon-si (KR); Jeong Hoon Kim, Suwon-si (KR); Byeong Hak Jo, Suwon-si (KR); Shinichi Iizuka, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 15 days.

(21) Appl. No.: 16/265,082

(22) Filed: Feb. 1, 2019

(65) Prior Publication Data

US 2020/0052651 A1     Feb. 13, 2020

(30) Foreign Application Priority Data

Aug. 9, 2018  (KR) .......................... 10-2018-0093312

(51) Int. Cl.
*H03F 3/04*     (2006.01)
*H03F 1/02*     (2006.01)
*H03F 3/21*     (2006.01)
*H03F 1/30*     (2006.01)

(52) U.S. Cl.
CPC ............ *H03F 1/0205* (2013.01); *H03F 3/21* (2013.01); *H03F 1/302* (2013.01); *H03F 2200/18* (2013.01); *H03F 2200/555* (2013.01)

(58) Field of Classification Search
CPC .... H03F 1/0205; H03F 3/21; H03F 2200/555; H03F 3/19; H03F 3/245; H03F 2200/451; H03F 1/0261; H03F 1/302; H03F 2200/18; H03F 1/301; H03G 3/3042; H03G 3/3047
USPC ................................................ 330/285, 296
See application file for complete search history.

(56) References Cited

U.S. PATENT DOCUMENTS 6,946,911 B2 * 9/2005 Yang ........................ H03F 1/302
                                                    330/285
7,129,786 B2 * 10/2006 Kim ........................ H03F 1/025
                                                    330/297
7,639,080 B2 * 12/2009 Nakayama .............. H03F 3/189
                                                    330/133

(Continued)

FOREIGN PATENT DOCUMENTS

KR  10-2015-0018780 A   2/2015
WO  WO 2012/111274 A1   8/2012
WO  WO 2013/173771 A1   11/2013

OTHER PUBLICATIONS

Korean Office Action dated Aug. 18, 2019 in corresponding Korean Patent Application No. 10-2018-0093312 (7 pages in English, 6 pages in Korean).

(Continued)

*Primary Examiner* — Khanh V Nguyen
(74) *Attorney, Agent, or Firm* — NSIP Law

(57) ABSTRACT

A power amplifier device includes a bias circuit to generate a startup current, which is based on an internal voltage and a startup voltage, during a startup time prior to a steady driving time point, and to generate a bias current, which is based on the internal voltage, after the steady driving time point, and a startup circuit to supply the bias circuit with the startup voltage during the startup time.

12 Claims, 4 Drawing Sheets

(56) References Cited

U.S. PATENT DOCUMENTS

| | | | | |
|---|---|---|---|---|
| 8,138,836 B2* | 3/2012 | Matsuzuka | ............... | H03F 3/19 |
| | | | | 330/296 |
| 8,432,227 B2* | 4/2013 | Okamura | ............. | H03F 1/0261 |
| | | | | 330/285 |
| 8,692,619 B2* | 4/2014 | Wakita | ................. | H03F 1/0261 |
| | | | | 330/289 |
| 8,854,142 B2* | 10/2014 | Iizuka | ....................... | H03F 3/19 |
| | | | | 330/296 |
| 9,065,389 B2* | 6/2015 | Ding | ....................... | H03F 1/302 |
| 9,077,291 B2* | 7/2015 | Sasaki | ....................... | H03F 3/21 |
| 9,628,029 B2 | 4/2017 | Huang et al. | | |
| 9,806,679 B2* | 10/2017 | Gorbachov | ........... | H03F 1/3205 |
| 10,027,320 B2* | 7/2018 | Won | ....................... | H03K 17/60 |
| 2013/0034144 A1 | 2/2013 | Doherty et al. | | |
| 2013/0293311 A1 | 11/2013 | Wakita et al. | | |
| 2019/0199303 A1* | 6/2019 | Hwang | ................. | H03F 1/0261 |

OTHER PUBLICATIONS

Yoon, Sang-Woong, "Static and Dynamic Error Vector Magnitude Behavior of 2.4-GHz Power Amplifier", *IEEE Transactions on Microwave Theory and Techniques*, Apr. 2007, pp. 643-647, vol. 55, No. 4 (5 pages in English).

* cited by examiner

POWER AMPLIFIER DEVICE WITH IMPROVED RESPONSE SPEED

CROSS-REFERENCE TO RELATED APPLICATION

This application claims the benefit under 35 U.S.C. § 119(a) of Korean Patent Application No. 10-2018-0093312 filed on Aug. 9, 2018 in the Korean Intellectual Property Office, the entire disclosure of which is incorporated herein by reference for all purposes.

BACKGROUND

1. Field

The following description relates to a power amplifier device with an improved response speed.

2. Description of Background

In general, a wireless communications method includes a time division duplexing (TDD) method and a frequency division duplexing (FDD) method. Both methods are used to communicate with more users using limited resources. The TDD method is a method of communicating with a plurality of users by dividing communications time at the same frequency by a predetermined interval and the FDD method is a method of performing communications by assigning a different frequency to respective users.

A conventional TDD method has an advantage of using a single frequency since it is a method of communicating with a plurality of users by dividing communications time at the same frequency by a predetermined interval. However, communications are performed by dividing the communications time and therefore, transmission and reception are repeatedly switched in a process of communications.

Accordingly, fast response speeds of a transmitter and a receiver are important performance factors in time division communications, and each amplifier circuit included in the transmitter and the receiver requires a fast response speed.

In order to improve the response speed of a conventional transmitter, it is necessary to further improve the response speed of a power amplifier of the transmitter. In particular, it is necessary for the power amplifier to quickly reach a steady state from a start-up in a short period of time.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a power amplifier device includes a bias circuit to generate a startup current, which is based on an internal voltage and a startup voltage, during a startup time prior to a steady driving time point, and to generate a bias current, which is based on the internal voltage, after the steady driving time point, and a startup circuit to supply the bias circuit with the startup voltage during the startup time.

The startup current may be greater than the bias current.

The bias circuit may include a first transistor having a base to receive the internal voltage and the startup voltage, a first resistor connected between a collector of the first transistor and a first voltage terminal, and a second resistor connected between an emitter of the first transistor and a bias connection node of a power amplifier circuit.

The startup circuit may supply the startup voltage to the bias circuit based on a first voltage supplied at the first voltage terminal.

The startup circuit may include a switch transistor connected between the first voltage terminal and a base connection node of the first transistor and operating in response to a control voltage having an ON-level during the startup time, and a bias resistor connected between a collector of the switch transistor and the first voltage terminal or connected between an emitter of the switch transistor and the base connection node of the first transistor.

The bias resistor may have a resistance value higher than a resistance value of the first resistor.

The bias circuit may further include a voltage source circuit to output the internal voltage, the voltage source circuit may include a third resistor, which has a first end connected to a reference voltage terminal, and first and second diode-connected transistors, which are connected between a second end of the third resistor and a ground in series, and the first diode-connected transistor may include a base and a collector connected to a base of the first transistor to supply the base of the first transistor with the internal voltage.

According to another general aspect, a power amplifier device includes a bias circuit to generate a startup current during a startup time prior to a steady driving time point, and to generate a bias current after the steady driving time point, a startup circuit to supply the bias circuit with a startup voltage during the startup time, and a power amplifier circuit to start up based on the startup current and to amplify an input signal based on the bias current.

The startup current may be greater than the bias current.

The bias circuit may include a first transistor having a base to receive an internal voltage and the startup voltage, a first resistor connected between a collector of the first transistor and a first voltage terminal, and a second resistor connected between an emitter of the first transistor and a bias connection node of the power amplifier circuit The startup circuit may supply the startup voltage to the bias circuit based on a first voltage supplied at the first voltage terminal.

The startup circuit may include a switch transistor connected between the first voltage terminal and a base connection node of the first transistor and operating in response to a control voltage having an ON-level during the startup time, and a bias resistor connected between a collector of the switch transistor and the first voltage terminal or connected between an emitter of the switch transistor and the base connection node of the first transistor.

The bias resistor may have a resistance value higher than a resistance value of the first resistor.

The bias circuit may further include a voltage source circuit to output the internal voltage, the voltage source circuit may include a third resistor having a first end connected to a reference voltage terminal and first and second diode-connected transistors connected in series between a second end of the third resistor and a ground, and the first diode-connected transistor may include a base and a collector connected to a base of the first transistor to supply the base of the first transistor with the internal voltage.

According to another general aspect, a bias circuit includes a voltage source circuit to output an internal voltage, and output circuit to generate a startup current based on the internal voltage and a startup voltage during a startup time, and to generate a bias current based on the internal voltage after completion of the startup time.

The voltage source circuit may include a first transistor, the output circuit may include a second transistor, and the first transistor may include a base and a collector connected to a base of the second transistor to supply the base of the second transistor with the internal voltage.

The first transistor and the second transistor may have the same temperature characteristics.

The output circuit may output the startup current to a power amplifier circuit during the startup time and output the bias current to the power amplifier circuit after completion of the startup time.

The voltage source circuit may include a first transistor, the output circuit may include a second transistor, the first transistor may include a base and a collector connected to a base of the second transistor to supply the base of the second transistor with the internal voltage, and the second transistor may generate the startup current and the bias current and to selectively output the startup current and the bias current to the third transistor.

The first transistor, the second transistor, and the third transistor may have the same temperature characteristics.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
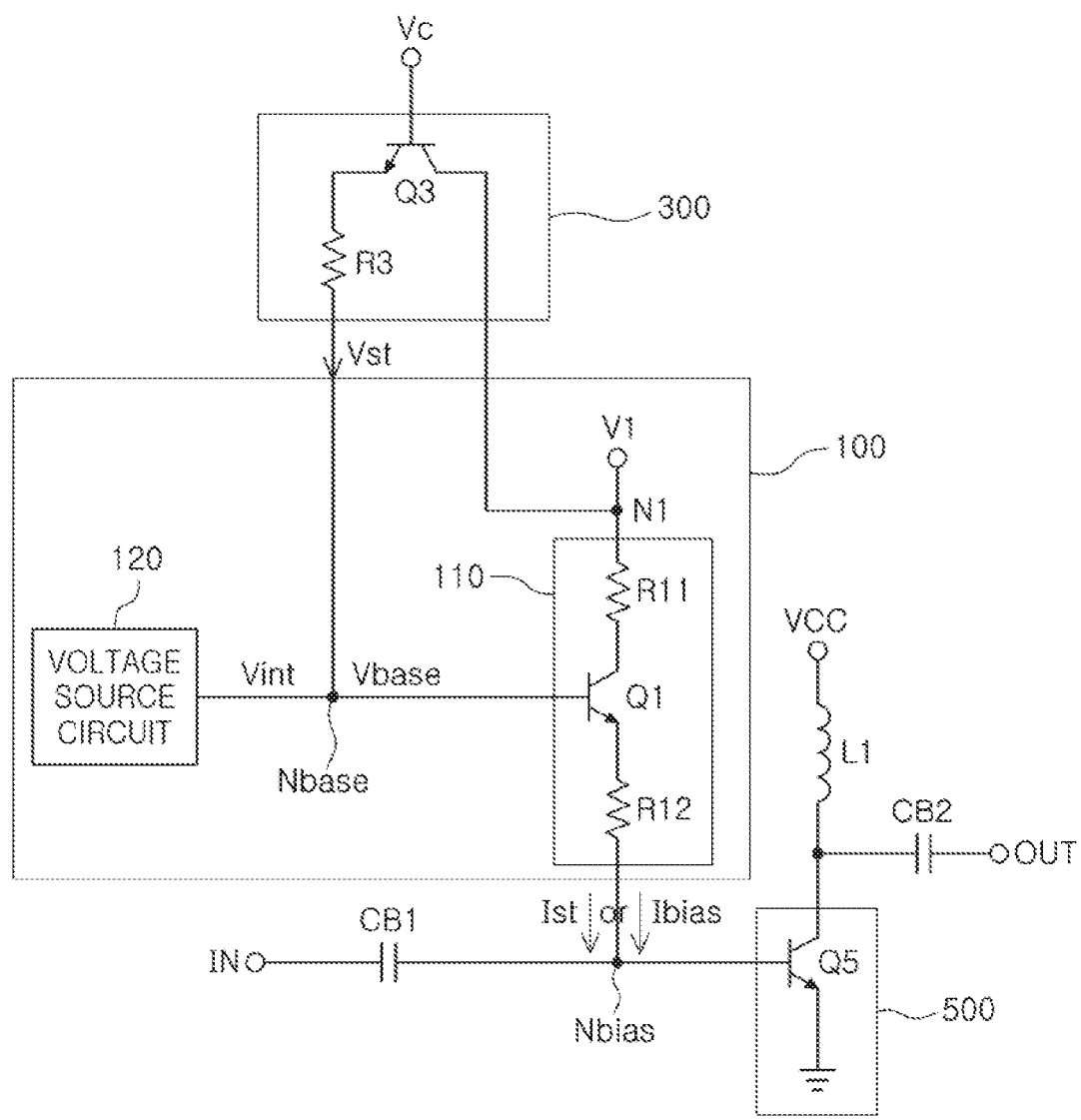
FIG. 1 is a diagram illustrating an example of a power amplifier device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, examples will be described in detail with reference to the accompanying drawings.

Figure 2:
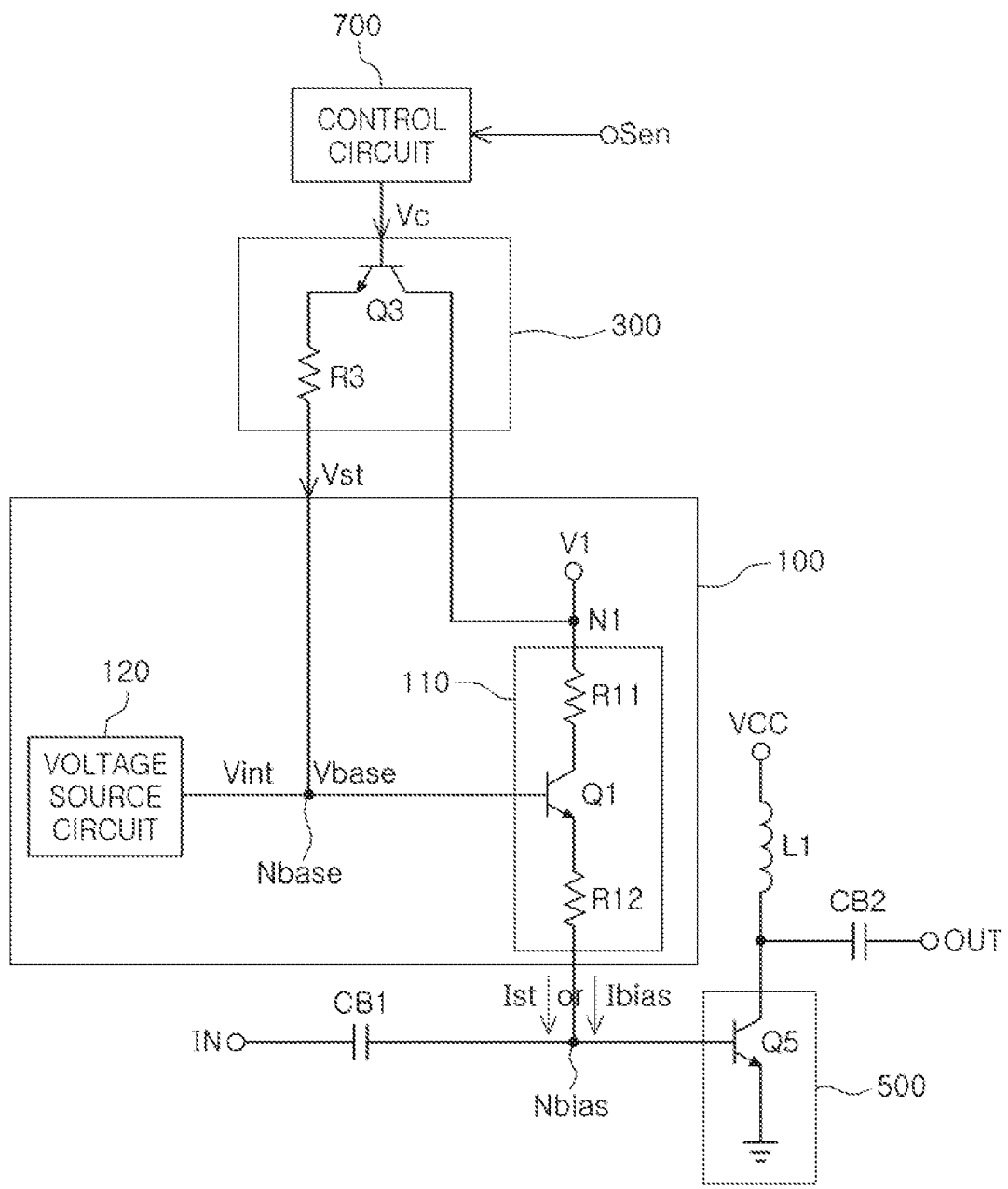
FIG. 2 is a diagram illustrating an example of a power amplifier device.

FIG. 1 is a diagram illustrating an example of a power amplifier device, and FIG. 2 is a diagram illustrating another example of a power amplifier device.

Referring to FIGS. 1 and 2, a power amplifier device may include a bias circuit 100, a startup circuit 300 and a power amplifier circuit 500.

The bias circuit 100 may generate a startup current Ist during a startup time ΔT from an operation start time point T1 to immediately before a steady driving time point T2, and generate a bias current Ibias from the steady driving time point T2 after the startup time ΔT.

For example, the bias circuit 100 may include a first transistor Q1 for generating the startup current Ist or the bias current Ibias.

The startup circuit 300 may supply a base connection node Nbase of the first transistor Q1 with a startup voltage Vst generated in response to a control voltage Vc in order to generate the startup current Ist during the startup time ΔT from the operation start time point T1 to immediately before the steady driving time point T2, and then may be turned off after the startup time ΔT.

For example, the startup circuit 300 may supply the startup voltage Vst based on a first voltage V1, and the startup current Ist may be greater than the bias current Ibias so that the power amplifier circuit 500 may quickly reach a steady state. The first voltage V1 may be a battery voltage. Hereinafter, the startup circuit 300 will be described with reference to FIG. 3.

For example, the bias circuit 100 may generate the startup current Ist based on an internal voltage Vint and the startup voltage Vst during the startup time ΔT and output the generated the startup current Ist to the power amplifier circuit 500. The bias circuit 100 may generate the bias current Ibias based on the internal voltage Vint after the startup time ΔT and output the generated bias current Ibias to the power amplifier circuit 500. Hereinafter, the bias circuit 100 will be described with reference to FIG. 3.

The power amplifier circuit 500 may start depending on the startup current Ist and quickly reach the steady state, and may operate depending on the bias current Ibias in the steady state.

For example, the power amplifier circuit 500 may include an amplifier transistor Q5. The amplifier transistor Q5 may include a collector connected to an operating voltage Vcc terminal through a coil L1, an emitter connected to a ground, and a base connected to an input terminal IN through a first capacitor CB1. The collector of the amplifier transistor Q5 may be connected to an output terminal OUT through a second capacitor CB2.

Referring to FIG. 2, the power amplifier device may further include a control circuit 700.

The control circuit 700 may provide the control voltage Vc to the startup circuit 300 in response to a system enable signal Sen.

For example, the control circuit 700 may provide the control voltage Vc having an OFF-level when the system enable signal Sen has a low level, and provide the control voltage Vc having an ON-level during the startup time ΔT when the system enable signal Sen transits from the low level to a high level.

In the respective drawings, unnecessarily overlapped descriptions are possibly omitted for components having the same reference numeral and the same function, and differences in the respective drawings will be described.

Figure 3:
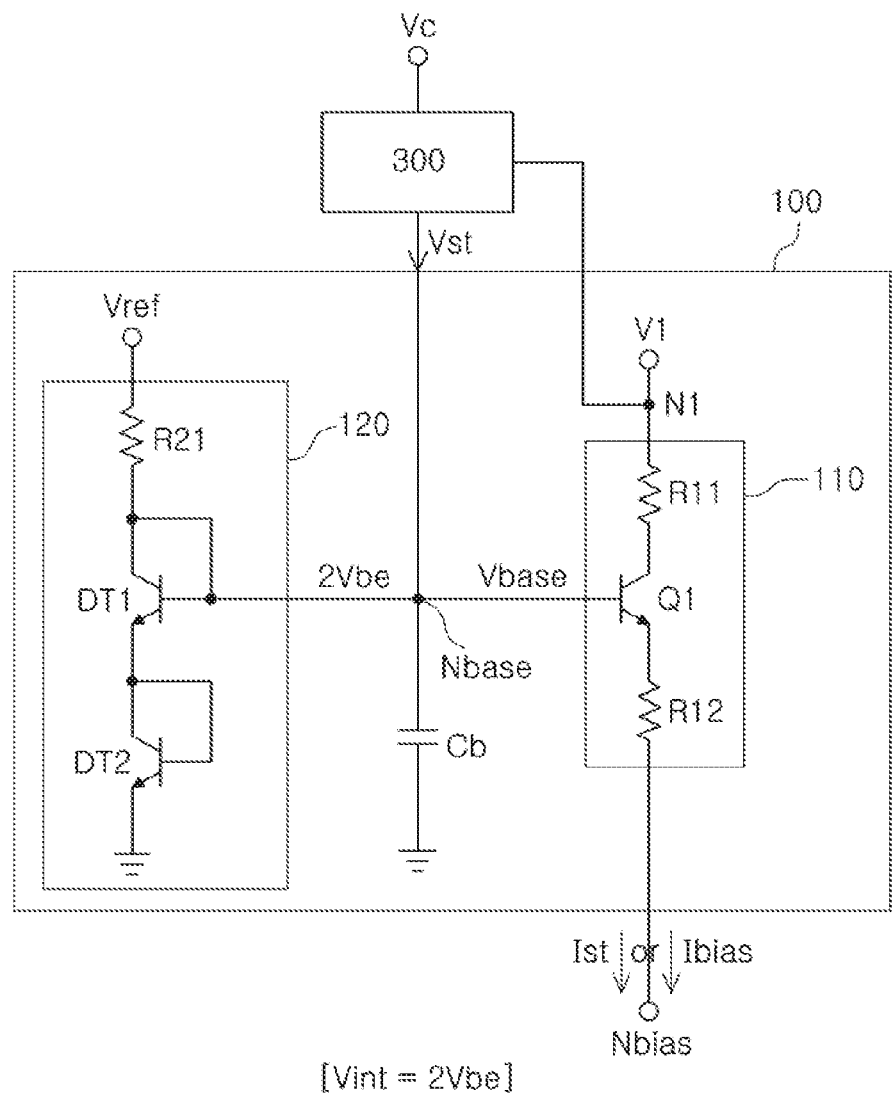
FIG. 3 is a diagram illustrating an example of a bias circuit.

FIG. 3 is a diagram illustrating an example of a bias circuit.

Referring to FIGS. 1, 2 and 3, the bias circuit 100 may include an output circuit 110 and a voltage source circuit 120.

The output circuit 110 may include the first transistor Q1, a first resistor R11 and a second resistor R12.

The first transistor Q1 may include a collector connected to the first voltage V1 terminal through the first resistor R11, an emitter connected to a bias connection node Nbias of the power amplifier circuit 500 through the second resistor R12, and a base receiving the internal voltage Vint and the startup voltage Vst.

The first transistor Q1 may generate the startup current Ist based on the internal voltage Vint and the startup voltage Vst during the startup time ΔT, and generate the bias current Ibias based on the internal voltage Vint from the steady driving time point T2 after the startup time ΔT.

For example, the first transistor Q1 may generate the startup current Ist depending on a base voltage Vbase based on the internal voltage Vint and the startup voltage Vst during the startup time ΔT. The first transistor Q1 may generate the bias current Ibias depending on the base voltage Vbase based on the internal voltage Vint from the steady driving time point T2 after the startup time ΔT.

The voltage source circuit 120 may output the internal voltage Vint.

Referring to FIGS. 1, 2 and 3, the startup circuit 300 may include, for example, at least one switch transistor Q3 and a bias resistor R3. This configuration is an example, and the configuration of the startup circuit is not limited to such a configuration.

The switch transistor Q3 may be connected between the first voltage V1 terminal and the base connection node Nbase of the first transistor Q1 and operate in response to the control voltage Vc having the ON-level during the startup time ΔT.

The bias resistor R3 may be connected between a collector of the switch transistor Q3 and the first voltage V1 terminal or between an emitter of the switch transistor Q3 and the base connection node Nbase. For example, the bias resistor R3 may have a resistance value higher than a resistance value of the first resistor R11.

For example, the switch transistor Q3 may be turned on in response to the control voltage Vc having the ON-level during the startup time ΔT.

Accordingly, the switch transistor Q3 may connect the first voltage V1 terminal and the base connection node Nbase of the first transistor Q1 through the bias resistor R3, and supply the base connection node Nbase of the first transistor Q1 with the startup voltage Vst.

Accordingly, the first transistor Q1 may generate the startup current Ist based on the internal voltage Vint and the startup voltage Vst during the startup time ΔT.

The switch transistor Q3 may be turned off in response to the control voltage Vc having an OFF-level from the steady driving time point T2 after the startup time ΔT. Accordingly, the first transistor Q1 may generate the bias current Ibias based on the internal voltage Vint from the steady driving time point T2 after the startup time ΔT.

The voltage source circuit 120 may further include a third resistor R21, a first diode-connected transistor DT1, and a second diode-connected transistor DT2, which are connected between a reference voltage Vref terminal and the ground in order to output the internal voltage Vint.

One end of the third resistor R21 may be connected to the reference voltage Vref terminal and the other end of the third resistor R21 may be connected to a collector of the first diode-connected transistor DT1.

A collector of the second diode-connected transistor DT2 may be connected to an emitter of the first diode-connected transistor DT1, the emitter of the second diode-connected transistor DT2 may be connected to the ground, and a base of the second diode-connected transistor DT2 may be connected to the collector.

The first diode-connected transistor DT1 may include a base and a collector connected to the base of the first transistor Q1 and supply the base of the first transistor Q1 with the internal voltage Vint.

Accordingly, the voltage source circuit 120 may output as the internal voltage Vint, twice a base-emitter voltage 2Vbe by the first and second diode-connected transistors DT1 and DT2.

In FIG. 3, for example, a capacitor Cb may be connected between the base of the first transistor Q1 and the ground in order to stabilize the base voltage of the first transistor Q1.

For example, as illustrated in FIG. 3, the voltage source circuit 120 may include two transistors, i.e. the first and second diode-connected transistors DT1 and DT2. Such a configuration is for responding to a change in characteristics of the first transistor Q1 included in the output circuit 110 and the amplifier transistor Q5 of the power amplifier circuit 500 depending on a temperature change. This configuration may compensate the change in characteristics of the first transistor Q1 and the amplifier transistor Q5 depending on the temperature change.

For example, the first and second diode-connected transistors DT1 and DT2 may be elements having the same temperature characteristics as the first transistor Q1 and the amplifier transistor Q5. In this case, accuracy of the temperature compensation may be maximized.

Figure 4:
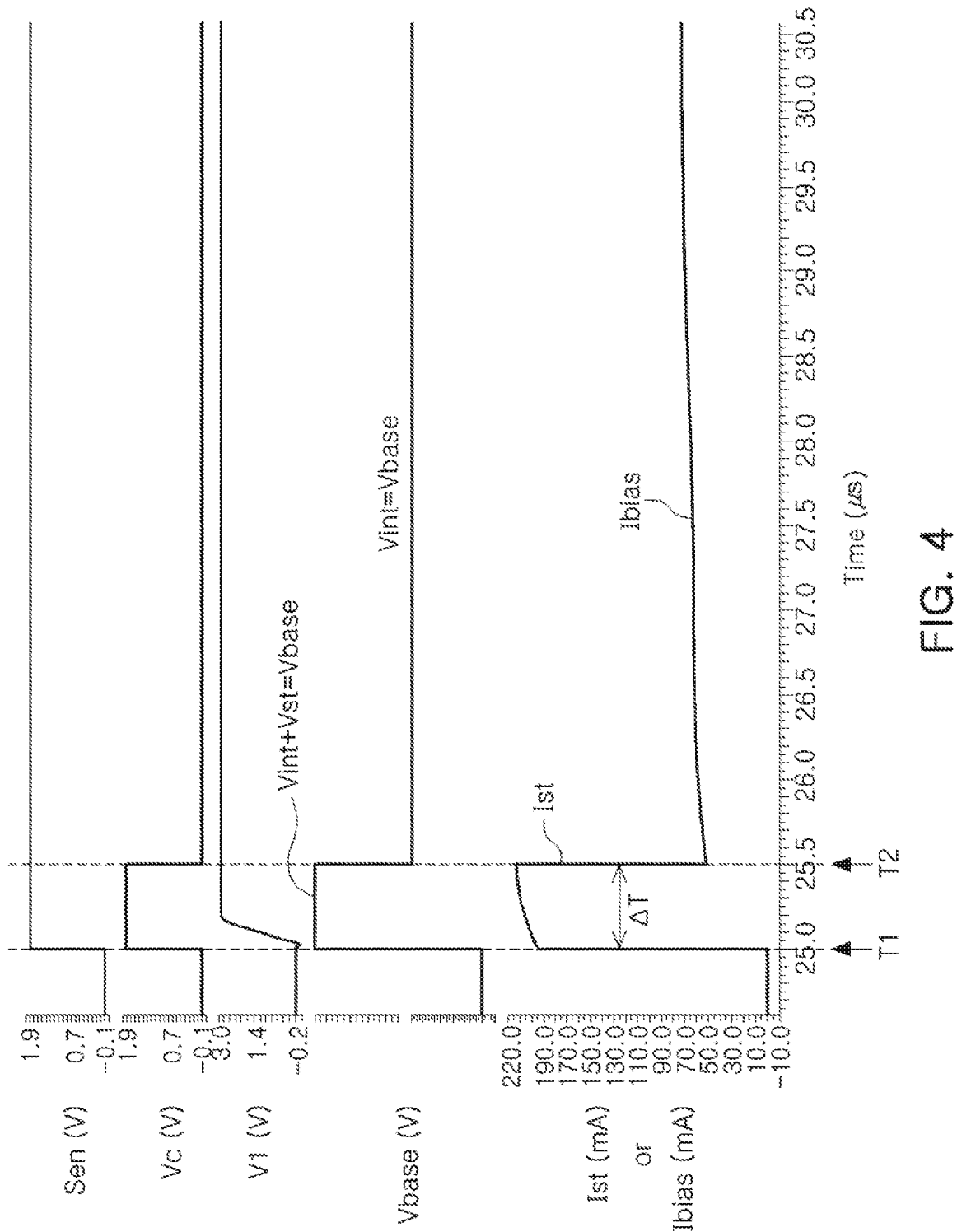
FIG. 4 is a diagram illustrating a waveform and timing of main voltages and currents according to an example.

FIG. 4 is a diagram illustrating a waveform and timing of main voltages and currents according to an example.

In FIG. 4, Sen indicates a system enable signal input to the control circuit 700, which may have a low level when a transmission system to which the present disclosure is applied is in a disabled state and may have a high level when the transmission system is in an enabled state.

Vc indicates the control voltage output from the control circuit 700 and may have the ON-level in synchronization with a rising of the system enable signal Sen, keep the ON-level during the start time point ΔT, and have an OFF-level after the startup time ΔT.

V1 indicates the first voltage. For example, the first voltage V1 may be the battery voltage, and supplied in synchronization with the rising of the system enable signal Sen.

Vbase indicates the base voltage of the first transistor Q1. The base voltage Vbase indicates a voltage based on the internal voltage Vint and the startup voltage Vst during the startup time ΔT and a voltage based on the internal voltage Vint from the steady driving time point T2 after the startup time ΔT.

Ibias indicates the bias current. The bias current Ibias may be generated depending on the base voltage Vbase based on the internal voltage Vint and the startup voltage Vst during the startup time ΔT and generated depending on the base voltage Vbase based on the internal voltage Vint from the steady driving time point T2 after the startup time ΔT.

The power amplifier device according to as the examples described above may be applied to a system including a transmitter or a communications module or a communications equipment requiring power amplification.

The control circuit of the power amplifier device according to the examples may be implemented in a computing environment (e.g., a peripheral component interconnect (PCI), a universal serial bus (USB), a firmware (Institute of Electrical and Electronics Engineers (IEEE) 1394), an optical bus structure, network, etc.) in which there may be an interconnection between a processor (e.g., a central processing unit (CPU), a graphics processing unit (GPU), a microprocessor, application specific integrated circuit (ASIC), Field programmable gate arrays (FPGAs), etc.); a memory (e.g., a volatile memory (e.g., a random access memory (RAM), a nonvolatile memory (e.g., a read only memory (ROM), a flash memory, etc.); an input device (e.g., a keyboard, a mouse, a pen, a voice input device, a touch input device, an infrared camera, a video input device, etc.); an output device (e.g., a display, a speaker, a printer, etc.); and a communications access device (e.g., a modem, a network interface card (NIC), an integrated network interface, a radio frequency transmitter/receiver, an infrared port, a USB connection device, etc.).

The computing environment may be implemented as, but is not limited to, a personal computer, a server computer, a handheld or laptop device, a mobile device (a mobile phone, a PDA, a media player, etc.), a multiprocessor system, a consumer electronic device, a minicomputer, a mainframe computer, a distributed computing environment including any of the aforementioned systems or devices.

As set forth above, according to the examples, the response speed of the power amplifier device may be improved by supplying the startup current Ist greater than the bias current Ibias supplied in the steady state at the start-up for a short period of time.

Through the improvement of the response speed, a dynamic-error-vector magnitude (EVM) correction characteristic may be satisfied.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifier device comprising:
    a bias circuit configured to generate a startup current, which is based on an internal voltage and a startup voltage, during a startup time prior to a steady driving time point, and to generate a bias current, which is based on the internal voltage, after the steady driving time point, the bias circuit comprising a first transistor having a base configured to receive the internal voltage and the startup voltage; and
    a startup circuit configured to supply the bias circuit with the startup voltage during the startup time, the startup circuit comprising:

a switch transistor connected between a first voltage terminal and a base connection node of the first transistor and configured to operate in response to a control voltage having an ON-level during the startup time; and a bias resistor connected between a collector of the switch transistor and the first voltage terminal or connected between an emitter of the switch transistor and the base connection node of the first transistor.

2. The power amplifier device of claim 1, wherein the startup current is greater than the bias current.

3. The power amplifier device of claim 2, wherein the bias circuit comprises:

a first resistor connected between a collector of the first transistor and the first voltage terminal; and a second resistor connected between an emitter of the first transistor and a bias connection node of a power amplifier circuit.

4. The power amplifier device of claim 3, wherein the startup circuit is configured to supply the startup voltage to the bias circuit based on a first voltage supplied at the first voltage terminal.

5. The power amplifier device of claim 3, wherein the bias resistor has a resistance value higher than a resistance value of the first resistor.

6. The power amplifier device of claim 3, wherein the bias circuit comprises a voltage source circuit configured to output the internal voltage, the voltage source circuit comprises a third resistor, which has a first end connected to a reference voltage terminal, and first and second diode-connected transistors, which are connected between a second end of the third resistor and a ground in series, and the first diode-connected transistor comprises a base and a collector connected to a base of the first transistor to supply the base of the first transistor with the internal voltage.

7. A power amplifier device comprising:

a bias circuit configured to generate a startup current during a startup time prior to a steady driving time point, and to generate a bias current after the steady driving time point, the bias circuit comprising a first transistor having a base configured to receive an internal voltage and the startup voltage;

a startup circuit configured to supply the bias circuit with a startup voltage during the startup time, the startup circuit comprising:

a switch transistor connected between a first voltage terminal and a base connection node of the first transistor and configured to operate in response to a control voltage having an ON-level during the startup time; and a bias resistor connected between a collector of the switch transistor and the first voltage terminal or connected between an emitter of the switch transistor and the base connection node of the first transistor; and a power amplifier circuit configured to start up based on the startup current and to amplify an input signal based on the bias current.

8. The power amplifier device of claim 7, wherein the startup current is greater than the bias current.

9. The power amplifier device of claim 8, wherein the bias circuit comprises:

a first resistor connected between a collector of the first transistor and the first voltage terminal; and a second resistor connected between an emitter of the first transistor and a bias connection node of the power amplifier circuit.

10. The power amplifier device of claim 9, wherein the startup circuit is configured to supply the startup voltage to the bias circuit based on a first voltage supplied at the first voltage terminal.

11. The power amplifier device of claim 9, wherein the bias resistor has a resistance value higher than a resistance value of the first resistor.

12. The power amplifier device of claim 9, wherein the bias circuit comprises a voltage source circuit configured to output the internal voltage, and the voltage source circuit comprises:

a third resistor having a first end connected to a reference voltage terminal; and first and second diode-connected transistors connected in series between a second end of the third resistor and a ground, wherein the first diode-connected transistor comprises a base and a collector connected to a base of the first transistor to supply the base of the first transistor with the internal voltage.

\* \* \* \* \*